United States Patent
Miehl et al.

(10) Patent No.: US 9,843,355 B2
(45) Date of Patent: Dec. 12, 2017

(54) APPARATUS AND METHOD FOR VENTING AND SEALING A PORTABLE COMMUNICATION DEVICE

(71) Applicant: MOTOROLA SOLUTIONS, INC, Chicago, IL (US)

(72) Inventors: Andrew P. Miehl, Boca Raton, FL (US); Jody H. Akens, Weston, FL (US); Peter B. Gilmore, Plantation, FL (US); Anthony M. Kakiel, Coral Springs, FL (US); Charles E. Kline, Plantation, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 15/496,005

(22) Filed: Apr. 25, 2017

(65) Prior Publication Data

US 2017/0230070 A1    Aug. 10, 2017

Related U.S. Application Data

(62) Division of application No. 14/974,774, filed on Dec. 18, 2015, now Pat. No. 9,667,297.

(51) Int. Cl.
*H04B 1/38*    (2015.01)
*H04B 1/3888*    (2015.01)
(Continued)

(52) U.S. Cl.
CPC ............ *H04B 1/3888* (2013.01); *A45C 11/00* (2013.01); *A45C 13/008* (2013.01); *A45F 5/00* (2013.01);
(Continued)

(58) Field of Classification Search
CPC .... H04B 10/40; H04B 5/0062; H04B 5/0081; H05K 13/0061; H05K 13/02; H05K 1/0393; H05K 1/09; H05K 1/097; H05K 1/11; H05K 1/118; H05K 1/147; H05K 1/181; H05K 2201/0338; H05K 2201/099; H05K 2201/1003; H05K 2203/0139
(Continued)

(56) References Cited

U.S. PATENT DOCUMENTS 4,465,189 A    8/1984    Molzan
4,534,208 A    8/1985    Macin et al.
(Continued)

*Primary Examiner* — Ajibola Akinyemi
(74) *Attorney, Agent, or Firm* — Barbara R. Doutre

(57) ABSTRACT

An improved venting and sealing assembly for a portable communication device is provided. The venting and sealing assembly is formed of a housing enclosure having a walled aperture with a bottom surface and an offset through-hole passing therethrough. A flexible substrate having a vent hole is coupled to the housing enclosure across the walled aperture such that the vent hole is offset from the offset through-hole. A breathable membrane is coupled across the vent hole of the flexible substrate. A rigid plate having an opening is coupled to the breathable membrane, the opening of the rigid plate being aligned with the vent hole of the flexible substrate. A closed-loop sealing rib is formed around the vent hole of the flexible substrate and/or upon the bottom surface of the walled aperture of the housing enclosure. The assembly provides a vent path and a self-sealing enclosure.

12 Claims, 3 Drawing Sheets

(51) Int. Cl.
  *A45F 5/00* (2006.01)
  *A45C 11/00* (2006.01)
  *A45C 13/00* (2006.01)

(52) U.S. Cl.
  CPC   *A45C 2011/002* (2013.01); *H04B 2001/3894* (2013.01)

(58) Field of Classification Search
  USPC ........................................................ 455/90.1
  See application file for complete search history.

(56) References Cited

U.S. PATENT DOCUMENTS

| | | | |
|---|---|---|---|
| 5,338,908 A * | 8/1994 | Rahman | H01H 9/047 200/302.1 |
| 5,956,053 A * | 9/1999 | Michael | B41J 2/16508 347/29 |
| 2008/0113523 A1 * | 5/2008 | Owen | F21S 48/337 439/36 |
| 2012/0188362 A1 | 7/2012 | Takimoto et al. | |

* cited by examiner

APPARATUS AND METHOD FOR VENTING AND SEALING A PORTABLE COMMUNICATION DEVICE

FIELD OF THE INVENTION

The present invention relates generally to venting and sealing assemblies and more particularly to venting and sealing a portable communication device.

BACKGROUND

Today's portable communication devices are challenged to incorporate an increasing number of features into a small form factor. Portable communication devices, such as portable radio products utilized in the public safety market, are further challenged by having to operate under severe environmental conditions where maintaining appropriate venting and sealing of the product is imperative to proper operation of the radio. The venting and sealing of the ruggedized product needs to be operational at predetermined pressure ratings not typically associated with off-the shelf consumer type products. For example, ever-increasing water submersion ratings for ruggedized products present venting and sealing challenges.

Many of today's typical venting approaches have drawbacks making them unsuitable for the portable radio public safety environment. For example, air hole structures which are completely passive for venting offer no sealing capability and thus no protection in wet environments. Products which utilize membranes that must be removed for test purposes face issues with improper re-alignment and large venting structures take up too much real estate and face potential leak issues.

Accordingly, it would be desirable to have an improved venting and sealing assembly. An improved venting and sealing assembly that could address the above aforementioned problems would be of particular benefit for incorporation into a portable communication device utilized in the public safety environment.

BRIEF DESCRIPTION OF THE FIGURES

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1A:
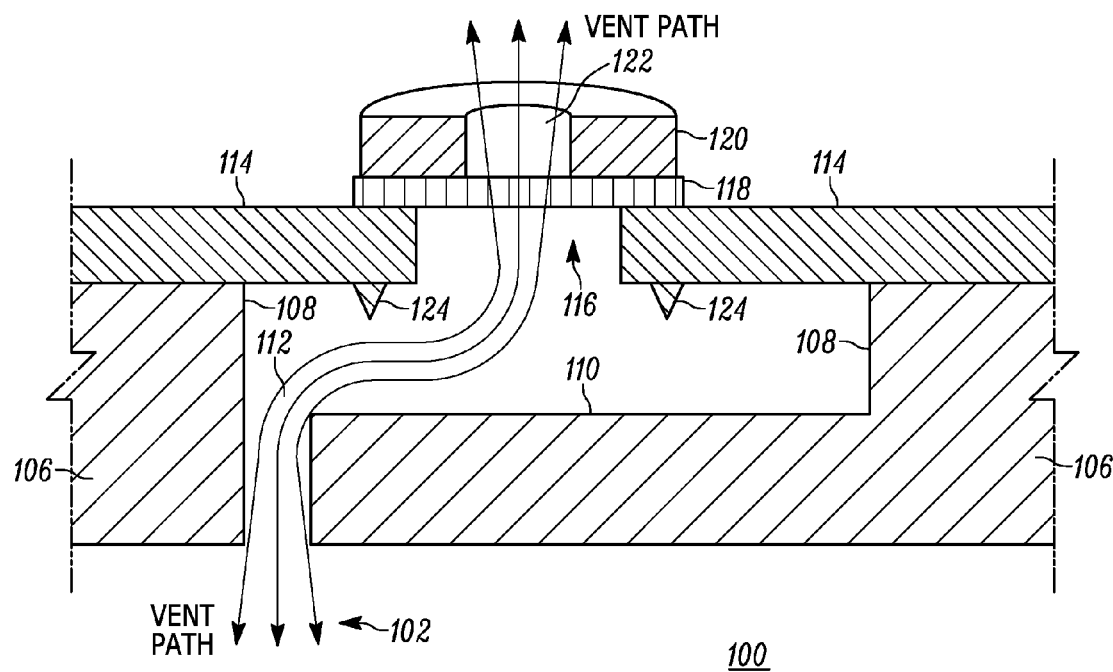
FIG. 1A is a partial cutaway view of a venting and sealing assembly having an open vent path in accordance with an embodiment.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in a venting and sealing assembly. The venting and sealing assembly can be incorporated into a communication device, such as a portable radio or remote speaker microphone, and is particularly well suited to portable communication devices intended for the public safety environment.

Briefly, a housing enclosure of the device provides an internal walled aperture providing a vent path formed therein passing from an interior of the housing to an exterior of the housing. A passive pressure equalization vent, formed of a breathable membrane, is mounted to an active sealing valve mechanism. The active sealing valve mechanism comprises a moveable substrate, which may be formed of a flexible or rigid material, which automatically seals to the internal walled aperture or vent path to create a pressure sensitive barrier in response to predetermined changes in pressure. An internal sealing rib surface limits travel of the moveable substrate within the internal walled aperture. The venting and sealing assembly takes up little space making it well suited for devices having limited space constraints.

Accordingly, the components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Figure 1B:
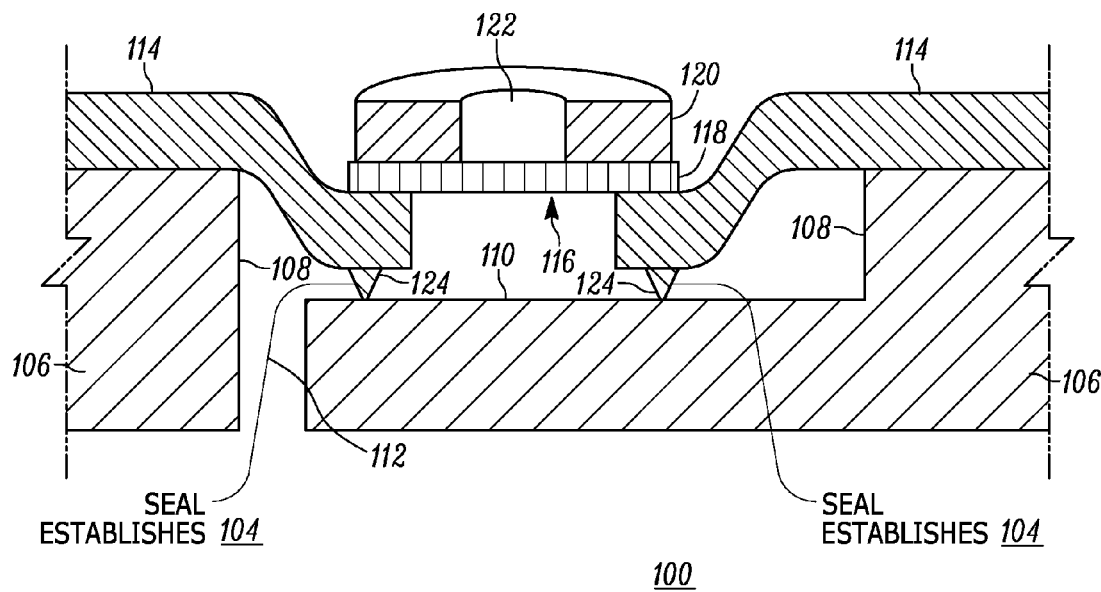
FIG. 1B is a partial cutaway view of the venting and sealing assembly of FIG. 1B having a sealed vent path closed in accordance with an embodiment.

FIGS. 1A and 1B show a partial cutaway view of a venting and sealing assembly 100 in accordance with an embodiment. FIG. 1A shows an open vent path 102 in accordance with an embodiment, while FIG. 1B shows a sealed vent path 104 being established in accordance with an embodiment. Assembly 100 comprises a housing enclosure 106 having a walled aperture 108 with a bottom surface 110 and an offset through-hole 112 passing therethrough. The assembly 100 further comprises a flexible substrate 114 having a vent hole 116, the flexible substrate being coupled to the housing enclosure 106 across the walled aperture 108. In accordance with an embodiment, the vent hole 116 of the flexible substrate 114 is offset from the offset through-hole 112 of the bottom surface 110 of the walled aperture 108. The flexible substrate 114 may be formed of a silicone rubber sheet, or suitable air impermeable and water impermeable material that allows for flexible vertical movement. In the embodiment of FIGS. 1A and 1B, a closed-loop sealing rib 124 is integrated around the vent hole 116 of the flexible substrate 114.

In accordance with an embodiment, a breathable membrane 118 is coupled across the vent hole 116 of the flexible substrate 114. The breathable membrane 118 may be formed of material having air breathable but water restrictive properties, such as expanded Polytetrafluoroethylene (PTFE) material, for example expanded TEFLON, or other appropriate material having air breathable and water restrictive properties. For example, membranes made of air-permeable and water-impermeable material, such as Gore-Tex® material available from W. L Gore, are suitable. For the purposes of this application, the breathable membrane 118 is considered to be air-permeable and water-impermeable. The breathable membrane 118 is adhesively coupled to the flexible substrate 114, such that membrane covers the vent hole 116 providing a barrier to water while allowing air to pass through.

In accordance with an embodiment, a rigid plate 120, having an opening 122, is coupled to the breathable membrane 118, such that the opening 122 of the rigid plate 120 is aligned with the vent hole 116 of the flexible substrate 114. The rigid plate 120 is formed of a stiffener material such as rigid plastic, for example stamped or molded plastic, to provide sufficient stiffness to back up the flexible substrate 114 over a closed-loop sealing rib 124.

During normal operation, the vent path 102 is formed through the offset through-hole 112 of the housing enclosure 106, the walled aperture 108 of housing enclosure 106, the vent hole 116 of the flexible substrate 114, and the breathable membrane 118 coupled across the vent hole 116 of the flexible substrate 114 and the opening 122 of the rigid plate 120. The breathable membrane 118 coupled across the vent hole 116 behaves as a passive pressure equalization vent.

In accordance with an embodiment, the rigid plate 120 provides an external rigid surface area that is larger than the internal sealing area created by the closed-loop sealing rib 124 thereby providing adequate sealed backup. The rigid plate 120 provides gain in the valve sealing pressure to securely isolate the breathable membrane 118 or in other words isolates the passive pressure equalization vent.

In accordance with other embodiments, the closed-loop sealing rib 124 may formed upon at least one of: the flexible substrate 114, around the vent hole 116 and/or upon the bottom surface 110 of the walled aperture 108 of the housing enclosure 106. In the embodiment of FIGS. 1A and 1B, the closed-loop sealing rib 124 is a closed-loop compliant seal rib integrated around the vent hole 116 of the flexible substrate 114.

In FIG. 1B, the flexible substrate 114 having a compliant closed-loop sealing rib 124 integrated thereon is shown establishing a seal against the bottom surface 110 of walled aperture 108. In this view, the flexible substrate 114 has collapsed in response to a predetermined change in pressure sensed through the breathable membrane 188 at vent hole 116. The sealing shown in FIG. 1B isolates the breathable membrane 118. The closed-loop sealing rib 124 limits travel of the flexible substrate 114. In accordance with an embodiment, the flexible substrate 114 operates as an active sealing valve mechanism to form a waterproof barrier over the walled aperture 108 of the housing enclosure 106.

Figure 2:
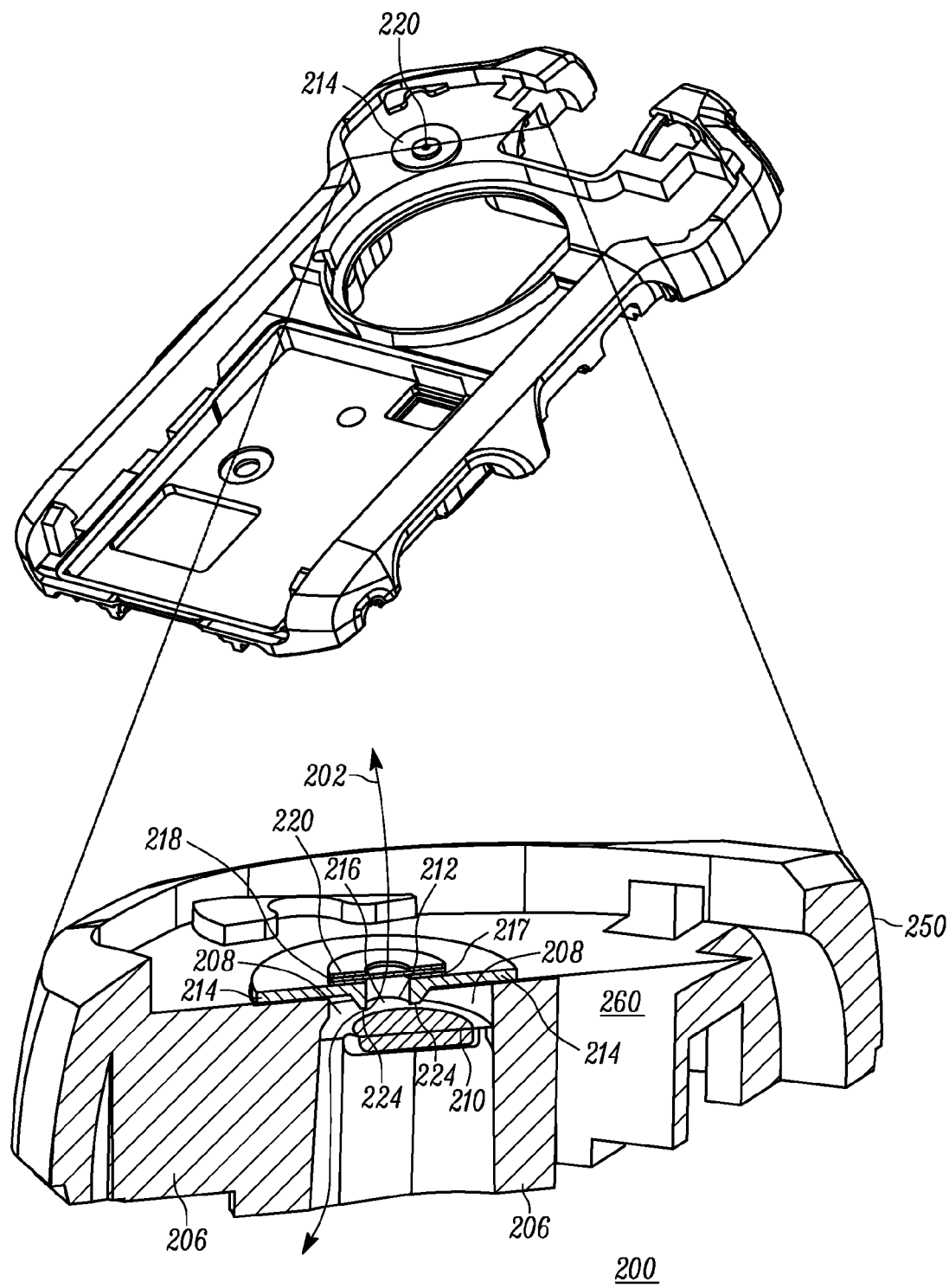
FIG. 2 is a partial cutaway isometric view of a portable radio incorporating a venting and sealing assembly in accordance with an embodiment.

FIG. 2 is a partial cutaway isometric view of a portable communication device, shown here as a portable radio 200, incorporating a venting and sealing assembly formed in accordance with an embodiment. Portable radio 200 comprises a housing 206 having an interior walled aperture 208 through which a vent path 202 vents and seals from an interior 260 of the housing 206 to an exterior 250.

In accordance with an embodiment, a moveable substrate 214 having a vent hole 216 operates as an active sealing valve mechanism. The moveable substrate 214 is mounted to the housing 206 such that the vent hole 216 opens into the interior walled aperture 208. A passive pressure equalization vent, formed of a breathable membrane 218, covers the vent hole 216 across the moveable substrate 214. In accordance with the embodiment, the active sealing valve mechanism (moveable substrate 214) and passive equalization vent (breathable membrane 218) automatically seal to the interior walled aperture 208 to create a pressure sensitive barrier—in response to predetermined changes in pressure.

In FIG. 2, the moveable substrate 214 comprises a flexible substrate coupled to the housing 206, wherein the internal sealing rib 224 is formed as part of an interior surface of a moveable substrate 214. An internal sealing rib 224 limits travel of the moveable substrate 214 within the interior walled aperture 208.

Figure 3:
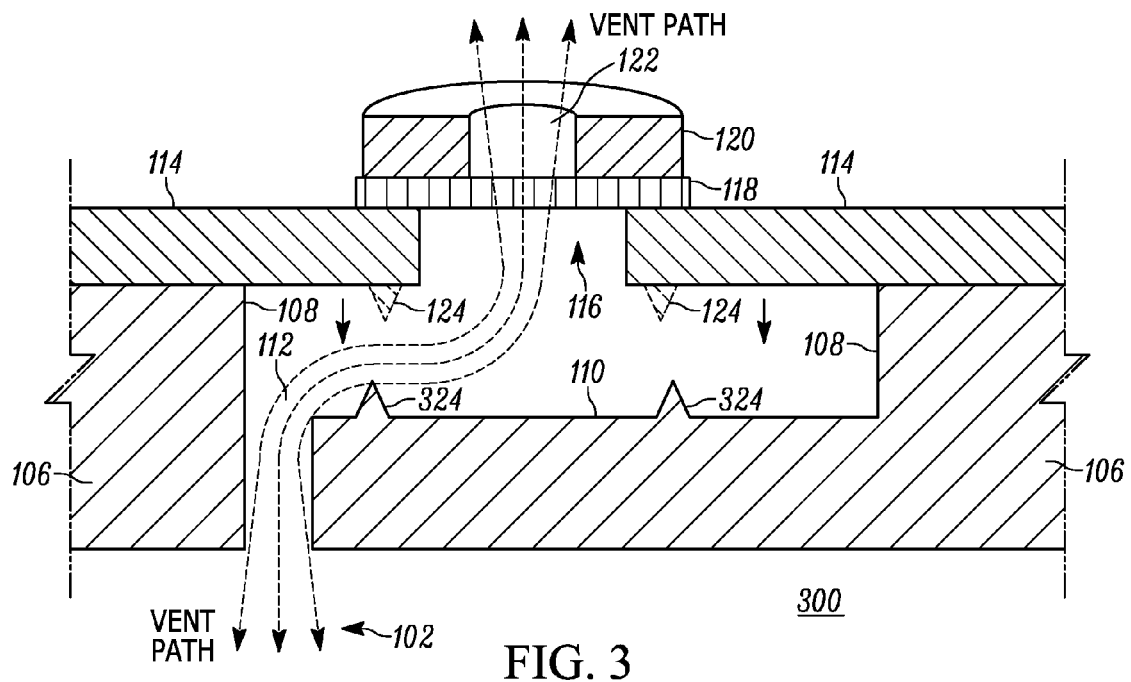
FIG. 3 is a partial cutaway view of a venting and sealing assembly having a vent path in accordance with another embodiment.

The internal sealing rib 224, as will be shown in the embodiment of FIG. 3, may also be formed on a bottom sealing surface of the internal walled housing. In yet another alternative embodiment, which will be described later in conjunction with FIG. 4, the moveable substrate may comprise a rigid substrate coupled to the housing with flexure bellows, and the internal rib sealing surface comprises a flexible substrate with a compliant sealing rib forming a base of the walled aperture.

Accordingly, the outer moveable substrate may be formed of either a flexible material or a rigid material. The exterior moveable substrate of the various embodiments gets pulled into the housing aperture in response to predetermined changes in pressure thereby forming a seal with the closed loop sealing rib. The various embodiments provide for an active sealing valve mechanism and passive equalization vent which automatically seals to an internal walled aperture to create a pressure sensitive barrier.

Changes in pressure can be caused by a variety of factors such as, including but not limited to: moving from a warm environment to a cold environment; from a cold environment to a warm environment; inefficiencies of internal components RF and audio power amplifiers (PAs) causing the air sealed within the enclosure to be heated and expand; long duration, maximum rate free-fall of high altitude low opening (HALO); rapid climbing maneuvers in an unpressurized helicopter; rapid environmental decompression (for example, a cabin airliner).

An advantage associated with the various embodiments is that the breathable membrane remains present both during factory testing of the venting and sealing assembly of the portable radio and after shipment of the portable radio, thereby eliminated any alignment issues associated with removal and replacement of a membrane for test purposes.

FIG. 3 is a partial cutaway view of a venting and sealing assembly 300 in accordance with another embodiment. Assembly 300 is similar to assembly 100 in that the assembly comprises housing enclosure 106 having a walled aperture 108 with bottom surface 110 and offset through-hole 112 passing therethrough. The assembly 300 further comprises flexible substrate 114 having vent hole 116, the flexible substrate being coupled to the housing enclosure 106 across the walled aperture 108. In accordance with the embodiment, the vent hole 116 of the flexible substrate 114 is offset from the offset through-hole 112 of the walled aperture's bottom surface 110. The breathable membrane 118 is coupled across the vent hole 116 of the flexible substrate 114. The rigid plate 120, having opening 122, is coupled to the breathable membrane 118, such that the opening 122 of the rigid plate is aligned with the vent hole 116 of the flexible substrate 114.

In accordance with this FIG. 3 embodiment, assembly 300 comprises a closed-loop sealing rib 324 formed as a hard-stop closed loop sealing rib integrated as part of the bottom surface 110 of the walled aperture 108 of the housing enclosure 106.

Similarly to assembly 100, in assembly 300 the vent path is provided through the offset through-hole 112 of the housing enclosure 106, the walled aperture 108 of housing enclosure 106, the vent hole 116 of the flexible substrate 114, the breathable membrane 118 coupled across the vent hole 116 of the flexible substrate 114 and the opening 122 of the rigid plate 120. However, in accordance with the embodiment of FIG. 3, as the flexible substrate 114 collapses, under predetermined pressure, into the walled aperture 108 against the bottom surface 110, the hard-stop closed-loop sealing rib 324 of the bottom surface 110 within the walled aperture 108 seals against the flexible substrate 114 thereby isolating the breathable membrane 118. The closed-loop rib 324 limits travel of the flexible substrate 114. The use of the hard-stop closed-loop sealing rib 324 on the stationary, bottom surface 110 for sealing purposes still results in an isolated breathable membrane 118.

In another embodiment also shown in FIG. 3, closed-loop sealing rib 124 (shown in dashed lines) and closed-loop sealing rib 324 may located on opposite upper and lower interior surfaces and slightly offset from each other, for a dual rib approach if desired. Thus, the closed loop sealing rib can be incorporated on one or both of the interior surfaces (i.e. interior bottom surface 110 and/or interior of surface of flexible substrate 114). For example, a combination of a hard-stop closed-loop sealing rib 324 and a compliant closed-loop sealing rib 124 can be used.

In accordance with this alternative embodiment, as the flexible substrate 114 collapses, under predetermined pressure, into the walled aperture 108 against the bottom surface 110, the closed-loop hard-stop sealing rib 324 seals against the flexible substrate 114 in conjunction with the compliant closed-loop sealing rib 124 sealing against the bottom surface 110 of walled aperture 108, thereby isolating the breathable membrane 118. The closed-loop sealing ribs 124 and 324 limit travel of the flexible substrate 114, thereby protecting the substrate surfaces, while providing a seal.

The embodiments provided thus far provide for a venting and sealing assembly wherein the breathable membrane provides a passive pressure equalization vent mounted in series with the moveable substrate which operates as an active sealing valve mechanism.

Figure 4:
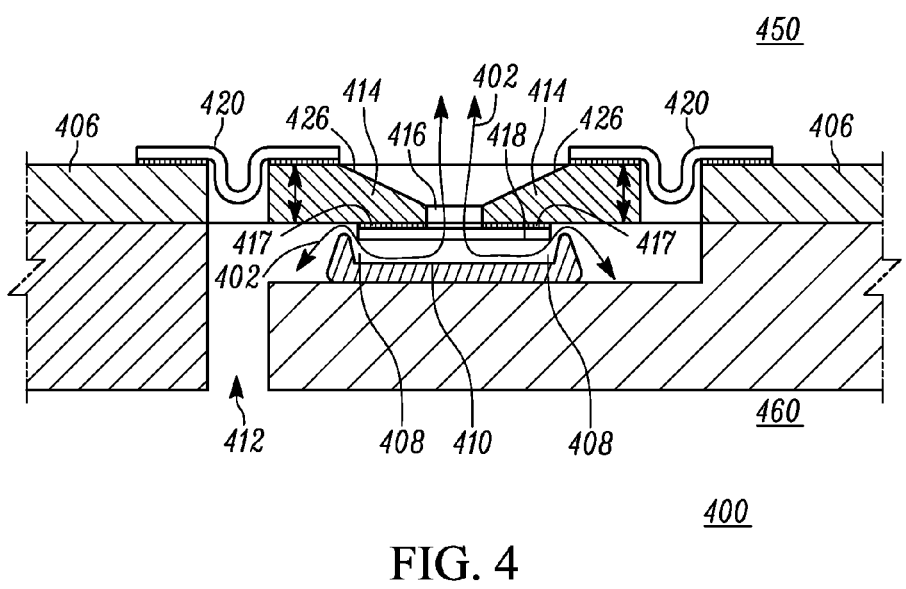
FIG. 4 is a partial cutaway view of a venting and sealing assembly having a vent path in accordance with another embodiment.

In another alternative embodiment, shown in FIG. 4, a breathable membrane provides a passive pressure equalization vent to a moveable rigid substrate separated by a vent passage across from an interior stationary flexible substrate. FIG. 4 is a partial cutaway view of a venting and sealing assembly 400 in accordance with this alternative embodiment.

Assembly 400 comprises a housing 406 having a moveable substrate portion, formed of a rigid material. The rigid material may be formed, for example, of the same or similar material to that as the housing 406, such as a hard plastic or other water impermeable material. In accordance with this embodiment, flexure bellows 420 or other flexible interconnect means, enable movement of the rigid substrate portion relative to the housing 406 and will therefore be referred to as moveable rigid substrate 414. A vent hole 416 is formed in the moveable rigid substrate 414 for venting between an interior 460 and an exterior 450 of the housing 406. The exterior 450 of the housing 406 is sometimes referred to as the wet side of the radio, while the interior of the housing 406 is sometimes referred to as the dry side.

In accordance with this embodiment, a breathable membrane 418 is coupled across the vent hole 416 of the moveable rigid substrate 414. The breathable membrane 418 is coupled across the vent hole 416 of the moveable rigid substrate 414 and adhesively coupled to the moveable rigid substrate 414 with an adhesive layer 417. The adhesive layer 417 has a cut-out which aligns with the vent hole 416 of the moveable rigid substrate 414. The adhesive layer 417, may be a pressure sensitive adhesive (PSA), such as a very high bond (VHB) adhesive or other suitable adhesive.

An internal rib sealing surface is provided by a flexible substrate 410 having a compliant sealing rib 424 formed thereon. The flexible substrate 410 is stationarily coupled within a walled aperture 408 formed within the housing 406. In accordance with the embodiment, the vent hole 416 of the moveable rigid substrate 414, covered by breathable membrane 418 opens into the walled aperture 408 across from the flexible substrate. The closed-loop sealing rib 424 is aligned and beneath the moveable rigid substrate 414 around the breathable membrane 418. In accordance with an embodiment, the moveable rigid substrate 414 (exterior movable surface) has a wider surface area than the flexible substrate 410 that provides the internal rib sealing surface (interior sealing surface). The use of the moveable rigid substrate 414 on the outer surface provides the stiffness backing in a similar manner to that of the rigid plate 120 in the previous embodiments, while the flexible substrate 410 is located in the interior side 460.

In response to predetermined changes in pressure being sensed between the interior 460 and the exterior 450 at the vent hole 416 by the restrictive properties of the breathable membrane 418, the moveable rigid substrate 414 is pulled into the walled aperture 408 against the closed-loop sealing rib 424 of the flexible substrate 410 thereby isolating the breathable membrane 418.

In normal use mode, the vent path 402 is formed between the exterior 450, the breathable membrane 418 covering the vent hole 416 of the moveable rigid substrate 414, the walled aperture 408, through the offset vent-hole 412 into interior 460. In sealing mode, the vent path 402 becomes sealed in response to the predetermined pressure (pressure mode) pulling the breathable membrane 418 coupled across the vent hole 416 of the moveable rigid substrate 414 across the closed-loop sealing rib 424 of the flexible substrate 410. Thus, venting and sealing have been provided by the embodiment of FIG. 4.

In accordance with an embodiment, the vent hole 416 of the moveable rigid substrate 414 may extend into a drainage cone 428 formed into the moveable rigid substrate for water drainage. Alternatively, the moveable rigid substrate 414 may extend straight out the vent hole 416, similarly to the opening 122 of the rigid plate 120 of the other previously described embodiments.

Accordingly, there has been provided, a substrate (flexible or rigid) that moves against a bottom surface of a walled aperture of a housing and seals using a closed loop sealing rib thereby isolating a breathable membrane coupled to the moveable substrate. The internal sealing rib limits travel of the moveable substrate within the interior walled aperture for sealing a vent passage.

The closed loop sealing rib may be formed on the interior surface of one or both of: a moveable flexible substrate 114, such as was shown by sealing rib 124, and an interior stationary bottom surface 110, such as was shown by sealing rib 324. The closed loop sealing rib 424 may also be formed on an interior stationary bottom flexible substrate 410.

For a normal use case, in each of the embodiments, force and deflection characteristics of the moveable outer substrate (flexible 114, 214 or rigid 414 outer substrate) and positioning of the one or more interior closed-loop ribs (124, 224, 324, 424) provide for the valve mechanism. For a pressure use case: the movable substrate (flexible 114, 214 or rigid 414) collapses into the walled aperture such that the closed loop rib seals the bottom surface, thereby isolating the breathable membrane (118, 218 or 418). In other words the pressure use case isolates the passive pressure equalization vent.

The self-pressure equalization provided by the assembly provides for automatic venting and sealing. The venting and sealing assembly is easy to test in that the breathable membrane 118, 218, 318, 418 need not be removed from the radio system prior to vacuum test, eliminating post-test alignment issues. A vacuum test can be performed during assembly of the product as opposed to just the membrane, thus advantageously allowing for the detection of even small leaks. No disabling of the breathable membrane, such as with water, is needed, during testing, thereby facilitating testing in a dry environment. Accordingly, there has been provided a waterproof venting and sealing system incorporated into a single portable communication device having a limited spatial form factor.

Any communication device where ruggedness and good sealing in a small form factor are desired can benefit from the venting and sealing assembly apparatus of the various embodiments.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A venting and sealing assembly, comprising:
   a housing enclosure having a walled aperture with a bottom surface and an offset through-hole passing therethrough;
   a flexible substrate having a vent hole, the flexible substrate being coupled to the housing enclosure across the walled aperture such that the vent hole is offset from the offset-through-hole;
   a breathable membrane coupled across the vent hole of the flexible substrate;
   a rigid plate having an opening coupled to the breathable membrane, the opening of the rigid plate being aligned with the vent hole of the flexible substrate; and
   a closed-loop sealing rib formed upon at least one of:
      the flexible substrate, around the vent hole;
      the housing enclosure, upon the bottom surface of the walled aperture.

2. The venting and sealing assembly of claim 1, wherein the flexible substrate is moveable relative to the housing enclosure to provide venting and sealing of the assembly.

3. The venting and sealing assembly of claim 2, wherein force and deflection characteristics of the flexible substrate and positioning of the closed-loop sealing rib is tuned as follows:
   for a normal use case:
   the assembly behaves as a passive pressure equalization vent; and
   for a pressure use case:
   the flexible substrate collapses into the walled aperture such that the closed loop rib seals against the bottom surface, thereby isolating the breathable membrane.

4. The venting and sealing assembly of claim 1, wherein the closed-loop sealing rib seals the flexible substrate with the housing enclosure in response to changes in pressure.

5. The venting and sealing assembly of claim 1, wherein a vent path is formed through the offset through-hole of the housing enclosure, the walled aperture of the housing enclosure, the vent hole of the flexible substrate, the breathable membrane coupled across the vent hole of the flexible substrate and the opening of the rigid plate.

6. The venting and sealing assembly of claim 1, wherein the rigid plate provides an external rigid surface area that is larger than an internal sealing area created by the closed-loop sealing rib.

7. The venting and sealing assembly of claim 1, wherein the closed-loop sealing rib comprises at least one of:
   a compliant closed loop sealing rib integrated with the flexible substrate around the vent hole;
   a hard-stop closed loop sealing rib integrated with the housing enclosure, upon the bottom surface of the walled aperture.

8. The venting and sealing assembly of claim 1, wherein the breathable membrane provides a passive pressure equalization vent mounted in series with the flexible substrate which operates as an active sealing valve mechanism.

9. The venting and sealing assembly of claim 8, wherein the rigid plate provides gain to the active sealing valve mechanism sealing pressure to securely isolate the passive pressure equalization vent.

10. The venting and sealing assembly of claim 1, wherein the flexible substrate operates as an active sealing valve mechanism to form a waterproof barrier over the walled aperture of the housing enclosure.

11. The venting and sealing assembly of claim 1, wherein the closed-loop sealing rib limits travel of the flexible substrate.

12. The venting and sealing assembly of claim 1, wherein the closed-loop sealing rib is formed around the vent hole upon two sides of the flexible substrate.

* * * * *